United States Patent
Hock Ho

(10) Patent No.: US 12,360,598 B2
(45) Date of Patent: Jul. 15, 2025

(54) SYSTEMS AND METHODS FOR MAGNETIC HAPTIC FEEDBACK

(71) Applicant: Bang & Olufsen A/S, Struer (DK)

(72) Inventor: Tee Hock Ho, Singapore (SG)

(73) Assignee: Bang & Olufsen A/S, Struer (DK)

( * ) Notice: Subject to any disclaimer, the term of this patent is extended or adjusted under 35 U.S.C. 154(b) by 383 days.

(21) Appl. No.: 17/937,201

(22) Filed: Sep. 30, 2022

(65) Prior Publication Data

US 2024/0111364 A1    Apr. 4, 2024

(51) Int. Cl.
*G06F 3/01* (2006.01)
*H02K 21/18* (2006.01)
*H04R 1/10* (2006.01)

(52) U.S. Cl.
CPC .......... *G06F 3/016* (2013.01); *H02K 21/185* (2013.01); *H04R 1/1008* (2013.01); *H04R 1/1041* (2013.01); *H04R 2460/03* (2013.01)

(58) Field of Classification Search
CPC ............... H04R 1/1008; H04R 1/1041; H04R 2460/03; H03K 2217/94057; H03K 2217/965; H02K 21/185; G06F 3/016
See application file for complete search history.

(56) References Cited

U.S. PATENT DOCUMENTS

| | | | | |
|---|---|---|---|---|
| 6,812,816 B1 * | 11/2004 | Easton | .................... | G01D 5/145 335/207 |
| 9,036,855 B2 * | 5/2015 | Shah | .................... | H04R 1/1041 381/384 |
| 10,146,309 B2 * | 12/2018 | Tissot | .................... | B60K 35/10 |
| 11,372,536 B2 | 6/2022 | Mistry et al. | | |
| 2006/0033703 A1 * | 2/2006 | Olien | .................... | G06F 3/0362 345/156 |
| 2009/0015360 A1 | 1/2009 | North et al. | | |
| 2012/0249315 A1 * | 10/2012 | Vanhelle | .................. | G05G 1/08 340/425.5 |
| 2013/0228029 A1 * | 9/2013 | Murphy | .................. | F16H 55/18 74/443 |
| 2015/0063586 A1 | 3/2015 | Shah | | |
| 2016/0085304 A1 | 3/2016 | Mistry et al. | | |
| 2016/0216762 A1 * | 7/2016 | Vanhelle | ................ | B60K 35/10 |

(Continued)

OTHER PUBLICATIONS

European Extended Search Report issued in 23200528.0, Feb. 2, 2024, 8 pgs.

*Primary Examiner* — Huyen D Le
(74) *Attorney, Agent, or Firm* — Patterson + Sheridan, LLP

(57) ABSTRACT

Various embodiments disclosed herein relate to a system and method whereby a haptic feedback mechanism may be integrated into a rotatable gear module such that rotating the module may generate pure mechanical haptic feedback. The gear module may be integrated into a wearable device, such as headphones, such that a set of magnets incorporated within may be aligned and misaligned with a plurality of teeth when the gear module rotates. In response to the rotation, each alignment and misalignment of the set of magnets with the plurality of teeth may generate pure haptic feedback. In embodiments, the gear module may be rotated to increment or decrement a unit of measurement associated with the headphones. Each unit of increment or decrement of change may produce haptic feedback based on the alignment and misalignment of the set of magnets.

20 Claims, 8 Drawing Sheets

(56) References Cited

U.S. PATENT DOCUMENTS

| | | |
|---|---|---|
| 2019/0107941 A1 | 4/2019 | O'Mahony et al. |
| 2020/0004346 A1 | 1/2020 | Vlasov et al. |
| 2021/0089136 A1 | 3/2021 | Hossain et al. |
| 2024/0114280 A1* | 4/2024 | Hock Ho .............. H04R 1/1025 |

* cited by examiner

SYSTEMS AND METHODS FOR MAGNETIC HAPTIC FEEDBACK

TECHNICAL FIELD

The present disclosure relates generally to haptic feedback systems, and more specifically, embodiments are directed to applications for purely mechanical haptic feedback systems within wearable devices, such as headphones.

BACKGROUND

Haptics is a tactile and force feedback technology that generates haptic feedback effects (also known as "haptic feedback" or "haptic effects"), such as forces, vibrations, and motions, for an individual using the individual's sense of touch. The haptic feedback may be discrete or continuous. Conventional haptic feedback systems tend to explore linear or counterweight vibrator(s), piezoelectricity ceramic disc(s), or utilize audio sound feedback to generate haptic feedback to the individual. Some haptically-enabled devices may include embedded hardware (e.g., actuators or other output mechanisms) configured to apply the haptic effects. The embedded hardware is, generally, programmed to apply (or playback) a particular set of haptic effects. For example, when a haptic signal specifying which haptic effect to play is received by embedded hardware in the haptically-enabled headphone system, the haptically-enabled headphone system renders the specified haptic effect. When an individual is intended to experience a haptic instance, the embedded hardware of a haptically-enabled headphone system receives a play command through control circuitry. The embedded hardware then applies the appropriate haptic effect.

Unfortunately, these conventional haptic feedback systems consume power from the device in which they are incorporated. Thus, the haptic feedback systems may drain power otherwise utilized by the device itself. This additional power drainage, effectively, may reduce the amount of operating time the device may realize. Additionally, such conventional systems may be complex or cumbersome relative to the device in which the haptic feedback system is integrated. Such integration may render maintenance of the device (e.g., battery changing) extremely difficult, if not impossible.

SUMMARY

Various embodiments disclosed herein relate to haptic feedback systems, and more specifically, embodiments directed to applications for purely mechanical haptic feedback systems within wearable devices, such as headphones.

One embodiment of the present disclosure provides a gear module for mechanical haptic feedback comprising a first gear module comprising a set of magnets arranged on a single plane of the first gear module, wherein the first gear module has a central axis. In embodiments, a second gear module comprises a daisy wheel having a plurality of teeth, wherein the second gear module is coaxial with the central axis of the first gear module. One of the first gear module or the second gear module is stationary and the other of the first gear module or the second gear module may be rotatable about the central axis, such that, in use, as at least one of the set of magnets is aligned and then misaligned with at least one of the plurality of teeth, a mechanical haptic feedback to a user is generated by the gear module.

In embodiments, the plurality of teeth extend outwardly from the daisy wheel and the daisy wheel is stationary relative to the set of magnets such that, during rotation, the set of magnets are rotationally aligned and misaligned vertically atop the plurality of teeth.

In embodiments, the plurality of teeth extend internally from the daisy wheel and the set of magnets is stationary relative to the plurality of teeth such that, during rotation, the plurality of teeth is rotationally aligned and misaligned with the set of magnets on the same horizontal plane, parallel to the set of teeth.

In embodiments, the set of magnets comprise a plurality of magnetic plates, wherein each magnetic plate comprises a north pole and a south pole.

In embodiments, each of the set of magnets is adhered within the first gear module.

In embodiments, one of the first gear module or the second gear module is rotatable for 360 degrees about the central axis.

In embodiments, the set of magnets is evenly distributed around the central axis in the first gear module.

In embodiments, the wheel module is integrated into a set of headphones and further comprises a grip wheel arranged externally on the set of headphones. In embodiments, rotation of the grip wheel by a user causes one or the other of the first gear module or the second gear module to rotate about the central axis.

In embodiments, causing one or the other of the first gear module or the second gear module to rotate about the central axis changes a volume output or a noise canceling output of the set of headphones One embodiment of the present disclosure provides a method of generating pure mechanical haptic feedback comprising integrating a first gear module with a set of magnets arranged on a single plane of the first gear module, wherein the first gear module has a central and integrating a second gear module with a daisy wheel having a plurality of teeth, wherein the second gear module is coaxial with the central axis of the first gear module. In embodiments, generating one or more mechanical haptic feedback instances to a user is provided, wherein one of the first gear module or the second gear module is rotating about the axis and the other one of the first gear module or the second gear module is stationary such that, during use, as at least one of the magnets is aligned and then misaligned with at least one of the plurality of teeth, mechanical haptic feedback instances are generated.

In embodiments, the method further comprising extending the plurality of teeth outwardly from the daisy wheel and securing the daisy wheel relative to the set of magnets such that, during rotation, the set of magnets are aligned and misaligned vertically above the plurality of teeth.

In embodiments, the method further comprising extending the plurality of teeth internally from the daisy wheel and securing the plurality of magnets relative to the teeth such that, during rotation, the plurality of teeth is rotationally aligned and misaligned with the plurality of magnets on the same horizontal plane, parallel to the plurality of magnets.

In embodiments, the method further comprising wherein the plurality of magnets further comprising a plurality of magnetic plates, wherein each magnetic plate comprises a north pole and a south pole.

In embodiments, the method further comprising adhering the plurality of magnets within the first gear module.

In embodiments, the method further comprising configuring one of the first gear module or the second gear module to be rotatable for 360 degrees about the central axis.

In embodiments, the method further comprising distributing the plurality of magnets evenly around the central axis in the first gear module.

In embodiments, the method further comprising incorporating the wheel module into a set of headphones and integrating a grip wheel externally arranged on the set of headphones, and wherein rotating the grip wheel by a user causes one or the other of the first gear module or the second gear module to rotate about the central axis.

In embodiments, the method further comprising causing the one or the other of the first gear module or the second gear module to rotate about the central axis changes a volume output or a noise canceling output of the set of headphones.

One embodiment of the present disclosure provides a wearable device capable of externalizing sound comprising one or more headphones including one or more speakers and a wheel module rotatable about an axis, configured to be integrated into at least one of the one or more headphones. In embodiments, the wheel module comprises a first gear module comprising a set of magnets arranged on a single plane of the first gear module, wherein the first gear module has a central axis; and a second gear module comprising a daisy wheel having a plurality of teeth, wherein the second gear module is coaxial with the central axis of the first gear module. In embodiments, one of the first gear module or the second gear module is stationary and the other of the first gear module or the second gear module is rotatable about the central axis, such that, in use, as at least one of the set of magnets is aligned and then misaligned with at least one of the plurality of teeth, mechanical haptic feedback to a user is generated by the gear module.

In embodiments, rotation of the wheel module increments or decrements a unit of measurement associated with the headphones. In embodiments, each unit of increment or decrement produces haptic feedback based on the alignment and misalignment between the set of magnets and the plurality of teeth.

The above summary is not intended to describe each illustrated embodiment or every implementation of the subject matter hereof. The figures and the detailed description that follow more particularly exemplify various embodiments.

Thus, there is a need for improved haptic feedback systems, particularly to haptic feedback systems implementing pure mechanical feedback.

These and other advantages and features will become more apparent from the following description taken in conjunction with the drawings.

BRIEF DESCRIPTION OF THE DRAWINGS

Subject matter hereof may be more completely understood in consideration of the following detailed description of various embodiments in connection with the accompanying figures, in which.

Figure 1:
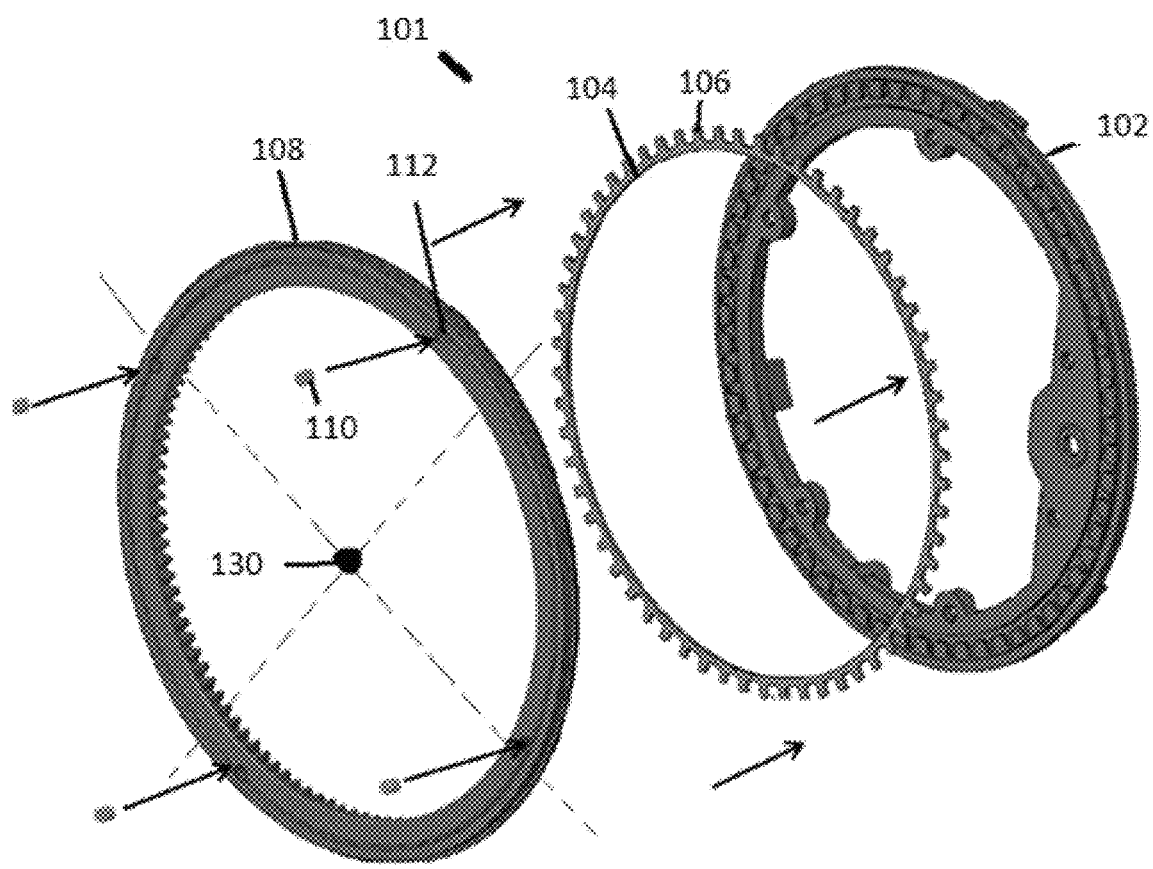
FIG. 1 depicts an exploded view of a gear module of a haptic feedback gear module, according to an embodiment.

While various embodiments are amenable to various modifications and alternative forms, specifics thereof have been shown by way of example in the drawings and will be described in detail. It should be understood, however, that the intention is not to limit the claimed disclosure to the particular embodiments described. On the contrary, the intention is to cover all modifications, equivalents, and alternatives falling within the spirit and scope of the subject matter as defined by the claims.

DETAILED DESCRIPTION

Reference now will be made in detail to embodiments of the disclosure, one or more examples of which are illustrated in the drawings. Each example is provided by way of explanation in the disclosure and is not limited thereto. In fact, it will be apparent to those skilled in the art that various modifications and variations can be made in the present disclosure without departing from the scope of the disclosure. For instance, features illustrated or described as part of one embodiment can be used with another embodiment to yield a still further embodiment. Thus, it is intended that the present disclosure covers such modifications and variations as come within the scope of the appended claims and their equivalents. As used herein, the term "or" is generally intended to be inclusive (i.e., "A or B" is intended to mean "A or B or both"). The terms "first," "second," and "third" may be used interchangeably to distinguish one component from another and are not intended to signify location or importance of the individual components.

Throughout the specification, and in the claims, the term "connected" means a direct electrical, mechanical, or magnetic connection between the things that are connected, without any intermediary devices. The terms "coupled" or "integrated" mean either a direct electrical, mechanical, or magnetic connection between the things that are connected or an indirect connection through one or more passive or active intermediary devices. The term "circuit," "module," or "mechanism" may refer to one or more passive and/or active components that are arranged to cooperate with one another to provide a desired function.

The terms "substantially," "close," "approximately," "near," and "about" generally refer to being within +/−10% of a target value. Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking, or in any other manner.

It is to be understood that the terms so used are interchangeable under appropriate circumstances such that the embodiments of the disclosure described herein are, for example, capable of operation in other orientations than those illustrated or otherwise described herein.

The terms "left," "right," "front," "back," "top," "bottom," "over," "under," and the like in the description and in the claims, if any, are used for descriptive purposes and not necessarily for describing permanent relative positions.

The present disclosure relates to a system and method whereby a haptic feedback mechanism may be integrated into a rotatable wheel module (such as a volume wheel or turn dial), such that rotating the wheel module may generate purely mechanical haptic feedback.

FIG. 1 depicts an exploded view of a haptic feedback gear module (GM) 101, according to an embodiment. In embodiments, GM 101 includes a lower gear module holder (LGM) 102 configured to accept a daisy wheel 104 with a plurality of external teeth 106, such that the LGM 102 and daisy wheel 104 may be integrated as a single piece of the GM 101. In embodiments, some or all of daisy wheel 104 may be constructed of a Ferrous (or other magnetic type) material and may be coated with a substance that prevents corrosion. In embodiments, an upper gear module holder (UGM) 108, being of approximately equivalent shape and size of the LGM 102, may be configured with one or more pockets 112 to accept an equal number of magnets 110 (e.g., neodymium magnets). As depicted, four magnets 110 may be inserted into corresponding pockets 112 and may be distributed equally throughout the UGM 108, though more or fewer magnets may be used in other embodiments. Placement of magnets 110 may include any form of adhesive (e.g., glue), or the magnets 110 and UGM 108 may be integrated as a single piece within the GM 101. In embodiments, the LGM 102 (incorporated with the daisy wheel 104) and the UGM 108 may be configured to coalesce such that the UGM 108 is situated vertically above the daisy wheel 104 and the external edges 109 of the UGM 108 become substantially aligned with the external edges 103 of the LGM 102. Magnets 110 may be configured to align with the teeth 106 of the daisy wheel 104.

In embodiments, as the wheel module (depicted in FIGS. 2A-B) rotates, about a center axis 130, the UGM 108 rotates about the center axis 130 which causes the magnets 110 to rotate vertically above and around the teeth 106. The rotation of the magnets 110 around the teeth 106 (i.e., the attraction and detraction between the magnets 110 and each tooth 106 of the daisy wheel 104 as the UGM 108 rotates) generates haptic feedback. In embodiments, as each magnet 110 rotates towards a tooth 106, aligns with the tooth 106 and then rotates past and away from the tooth 106, a haptic feedback instance may be produced (e.g., a click or pulse indicating a unit of rotation based on the spacing between the teeth 106 of the daisy wheel 104), described further in FIGS. 3A-B.

In embodiments, four magnets 110 and pockets 112 may be incorporated into the GM 101 with a 90° distribution, however, the foregoing is illustrative of various example embodiments and is not to be construed as limiting thereof. In an example, three magnets 110 and pockets 112 may be incorporated into the GM 101 with a 120° distribution. In an example, eight magnets 110 and pockets 112 may be incorporated into the GM 100 with a 45° distribution. In other words, one or more magnets 110 may be used and, as the number of magnets 110 used and incorporated into GM 101 increases (e.g., for even magnet distribution), their degree of distribution will approach closer and closer to a 0° distribution. Though the magnets 110 will be spaced apart equally in some embodiments, in other embodiments the magnets 110 may have other arrangements, such as to provide a particular haptic output or feeling. The number of magnets 110 and pockets 112 may vary according to haptic feedback preferences and overall size of the wheel module. An increase or decrease in the number of magnets 110 may increase or decrease, respectively, the amount of haptic feedback experienced. In embodiments, the magnets 110 may vary in size depending on GM 101 size restrictions and required haptic feedback generation. Increasing or decreasing the size (or magnetic force) of the magnets 110 may increase or decrease, respectively, the amount of attraction and detraction caused by the rotatable interaction with the teeth 106 of the daisy wheel 104, thus increasing or decreasing the amount of haptic feedback produced. In embodiments, the magnets may be cylindrical with an approximate diameter between 1.00-3.00 mm and approximate dimensions between 1-3 mm in length by 1-3 mm in width. However, the size is not limited thereto. In embodiments, as size of the wheel module varies the number of magnets 110 incorporated into the UGM 108 may vary. For example, as size increases, more magnets 110 may be required for sufficient haptic feedback production. In yet another example, as size decreases, fewer magnets 110 may be required due to lack of sufficient space within the UGM 108 or due to less magnetic force required to generate haptic force within a smaller wheel module.

Furthermore, the number of teeth 106 may vary according to haptic feedback preferences or goals. Increasing or decreasing the number of teeth 106 and adjusting their spacing may alter the instances in which haptic feedback is produced. Increasing the number of teeth 106 may produce more frequent haptic feedback instances and decreasing the number of teeth 106 may result in less frequent haptic feedback instances. While sixty teeth 106 implemented per revolution of the daisy wheel 104 may be depicted in FIG. 1, other variations may be realized. For example, half as many teeth (e.g., 30 teeth) may be implemented which would reduce the frequency of haptic feedback instances, relative to the sixty teeth implementation example. In another example, twice as many teeth (e.g., 120 teeth) may be implemented (depending on size/radius of the daisy wheel and the width of the teeth) which may increase the frequency of haptic feedback instance, relative to the sixty teeth implantation example.

In embodiments, the teeth 106 may not necessarily be evenly distributed (i.e., spacing between each tooth need not be consistent). For example, two or more teeth 106 may be spaced closer together with a larger space following the two or more teeth 106. Thus, when the UGM 108 rotates, a more frequent/multiple haptic feedback instance may be produced, following a longer pause before the next haptic feedback instance.

In embodiments, the teeth 106 of the daisy wheel 104 may differ in width. While a tooth 106 with a width of 1.0 mm may be implemented, with reference to FIG. 1, other variations may be realized. For example, teeth 106 with a width of 0.5 mm may be implemented in order to reduce the amount of magnetic force, thus reducing the amount of haptic feedback generated relative to embodiments implementing teeth 106 with a width of 1.0 mm. In another example, teeth 106 with a width of 1.5 mm may be implemented in order to increase the amount of magnetic force, thus increasing the amount of haptic feedback generated relative to embodiments implementing teeth with a width of 1.0 mm. In embodiments, the thickness of the teeth 106 may vary. While a tooth 106 with a thickness of 0.5 mm may be implemented with reference to FIG. 1, the thickness may be increased (e.g., to 1.0 mm) or decreased (e.g., to 0.25 mm) to increase or decrease, respectively, the amount of magnetic force generated. These additional factors (e.g., such as the actual size and shape of the daisy wheel teeth), may be adapted to influence the strength of the magnetic attraction force within the GM 101, thus effecting the haptic feedback.

Figures 2A, 2B:
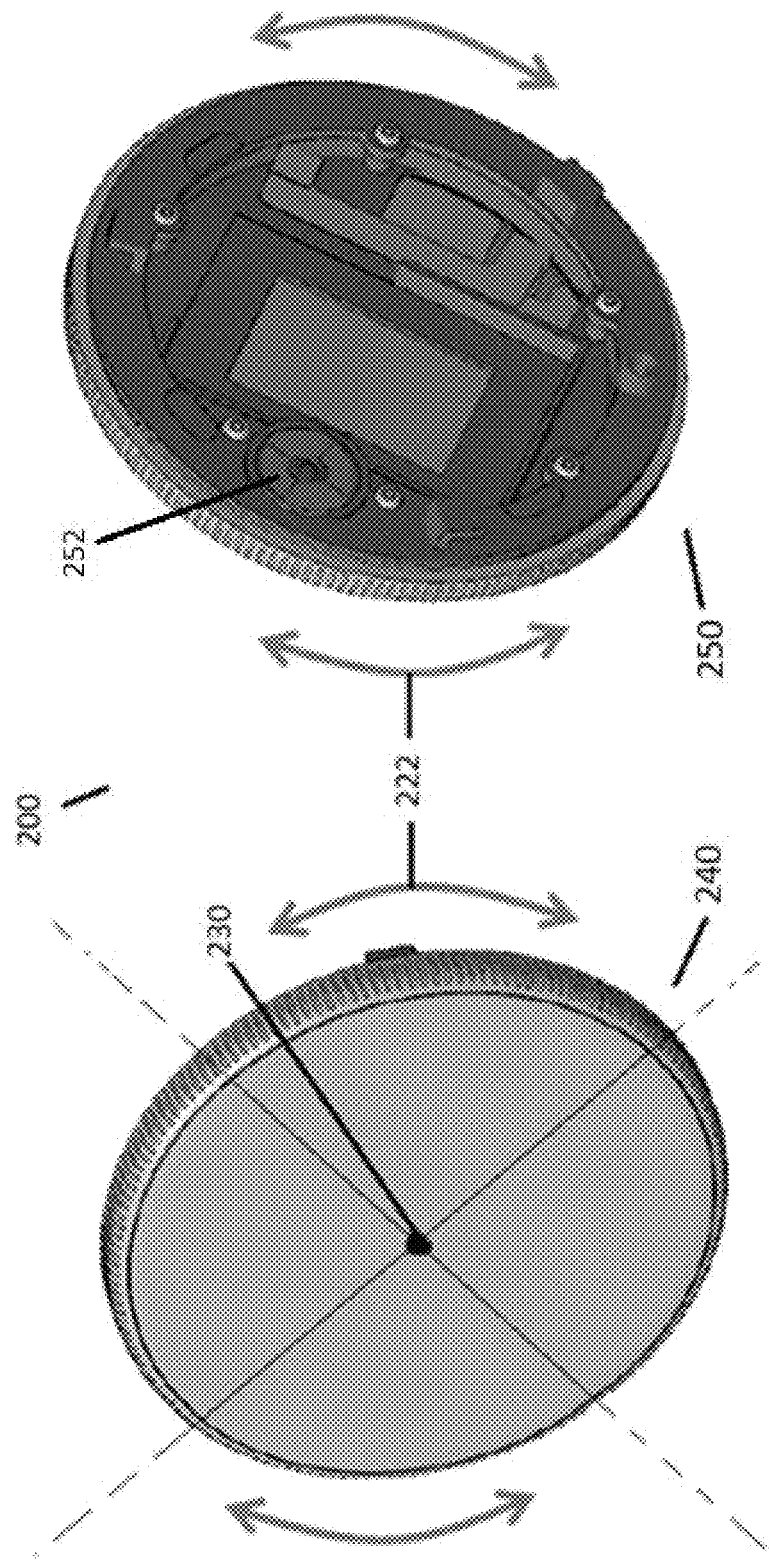
FIG. 2A depicts a front-view of a control wheel module incorporated with a haptic feedback gear module, according to an embodiment.
FIG. 2B depicts a rear-view of a control wheel module incorporated with a haptic feedback gear module, according to an embodiment.

FIG. 2A depicts a front-surface of a wheel module 200 and FIG. 2B depicts a rear-view of a wheel module 200 incorporated with a GM (embodiments depicted in FIGS. 1 and 3-7B). In embodiments, the wheel module 200 may be configured to attach and detach, or otherwise be integrated into an electronic device, such as headphones, via rear-surface 250. In embodiments, the wheel module 200 comprises a front-surface 240 to be displayed outward, facing an individual. In embodiments, the wheel module 200 may be constructed from any number of materials enabling structural support and varying wear conditions (e.g., aluminum, plastic, etc.).

In embodiments, the wheel module 200, integrated with a GM as described herein, may be structurally integrated into an electronic device such that the wheel may be freely rotated (+/−360°) in a clockwise and counterclockwise rotation 222 about a center axis 230. In embodiments, other movement mechanisms may be realized by the wheel module such as a single tap (i.e., pressing the wheel inward), a double tap, a press and hold, a swipe or toggle up/down and a swipe or toggle left/right.

In embodiments, the wheel module 200 may act as a wheel or dial rotatable about the axis 230. In turn, at least one component of the incorporated GM may be rotated about axis 230, causing haptic feedback generation. In embodiments, rotation of the wheel module 200 may correspond to/alter any number of preferences (e.g., units of measurement) in which the wheel module is integrated, such as volume control (up or down), transparency mode level, transparency of active noise-cancelling (ANC) functions, or other functions, as assigned and programmed by appropriate software or firmware. In embodiments, the wheel module 200 may include a decoder disc(s) 252 (such as coper plates) that transfers the mechanical signal produced by rotating the wheel module 200 (i.e. the "signal"), to be sensed by a corresponding sensor or sensing coils (not shown) on a printed circuit board assembly (PCBA) (not shown) of the electronic device in which the wheel module 200 may be integrated. In embodiments, the signal exchange methodology may include one of the following: (1) a signal exchange between metal elements of the wheel module (e.g., copper) and sensing coils of the electronic device; (2) a signal exchange between grated disc(s) of the wheel module and optical sensors of the electronic device; or (3) a signal exchange between magnetic elements of the wheel module and magnetic sensors of the wheel module.

In embodiments, the wheel module 200 and GM may vary in size. The GM may be portable and scalable to any other similar turning wheel design (e.g., wheels, knobs, dials), whether they be standalone products or integrated into other parts of a product. For example, if a greater or smaller sized wheel module is necessary for a particular system, the wheel module and the incorporated GM may be sized accordingly for proper incorporation and sufficient haptic feedback, as described herein. In embodiments, the wheel module 100 may have an outer diameter of at least 50 mm (e.g., approximately 64) and may have an overall width (including attachment mechanisms) of at least 9 mm (e.g., approximately 9.9 mm). The width of the wheel module 200 (incorporated with the GM) may be at least 6 mm (e.g., approximately 6.8 mm). In embodiments, the haptic feedback generated by the GM may be purely mechanical (e.g., no linear or counterweight vibrators, piezoelectricity ceramic discs or audio sound feedbacks implemented). While various sizes and dimension have been described herein, the foregoing are illustrative of various example embodiments and are not to be construed as limiting thereof.

Figure 3A:
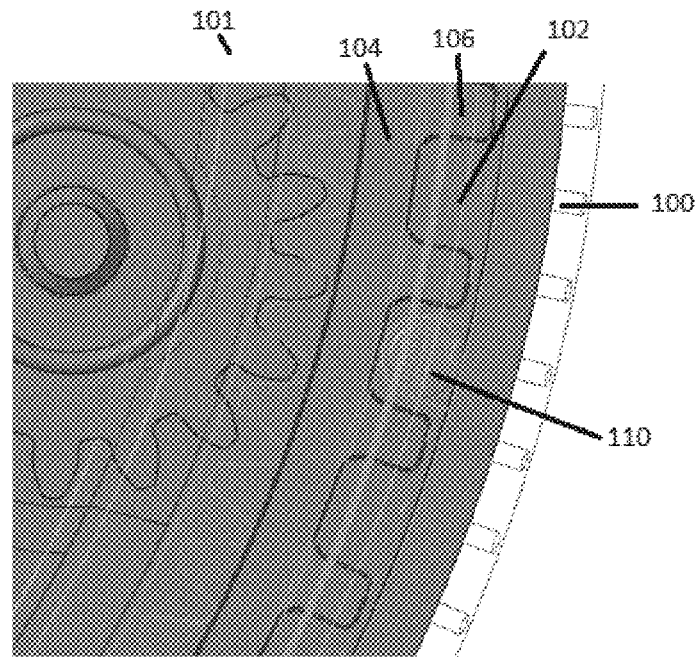
FIG. 3A depicts a see-through view of a haptic feedback gear module, according to an embodiment of FIG. 1.
Figure 3B:
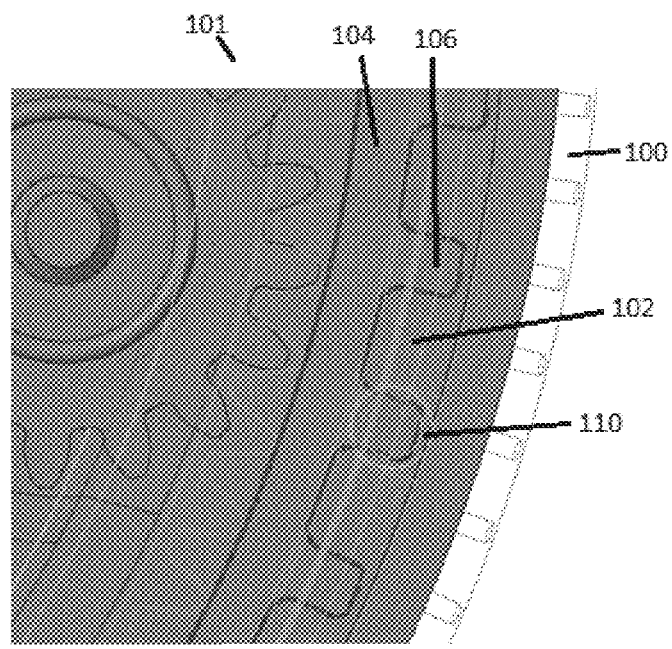
FIG. 3B depicts a see-through view of a gear module of a mechanical haptic feedback system, according to an embodiment of FIG. 1.

FIGS. 3A-B depict see-through views of a GM 101, according to an embodiment of FIG. 1. In embodiments, the magnet(s) 110 distributed throughout the UGM 108 may become aligned and misaligned with teeth 106 of daisy wheel 104 (incorporated into LGM 102) as the wheel module 100 rotates (e.g., counterclockwise or clockwise) about a center axis (not depicted). FIG. 3A illustrates an instance in which, during rotation of the wheel module 100, a magnet 110 is misaligned with teeth 106. In this instance, the position of the magnet 110, relative to the teeth 106, creates a low magnetic attraction force applied to wheel module 100. FIG. 3B illustrates an instance in which, during rotation of the wheel module 100, a magnet 110 is aligned with teeth 106. In this instance, the position of the magnet 110, relative to the teeth 106, creates a high magnetic attraction force. As the magnets 110 alternate between alignment and misalignment, magnetic force is increased and decreased between the magnets 110 and the teeth 106, resulting in pure mechanical haptic feedback generation.

Figure 4A:
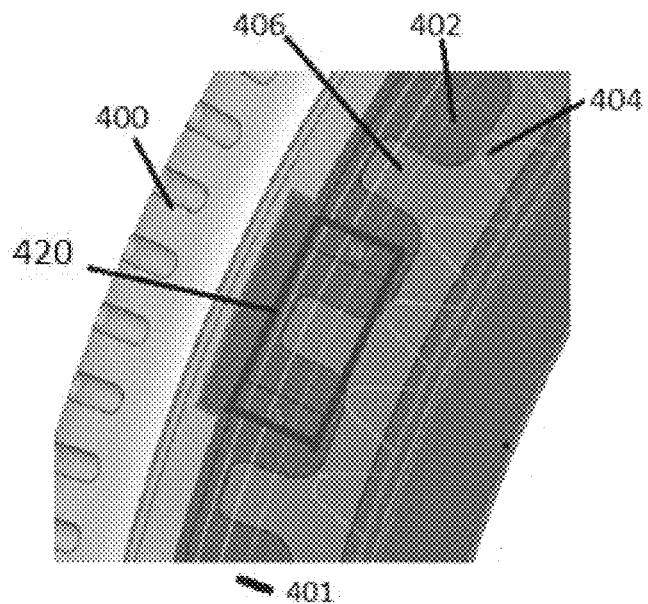
FIG. 4A depicts a see-through view of a haptic feedback gear module, according to an alternative embodiment of FIG. 1.
Figure 4B:
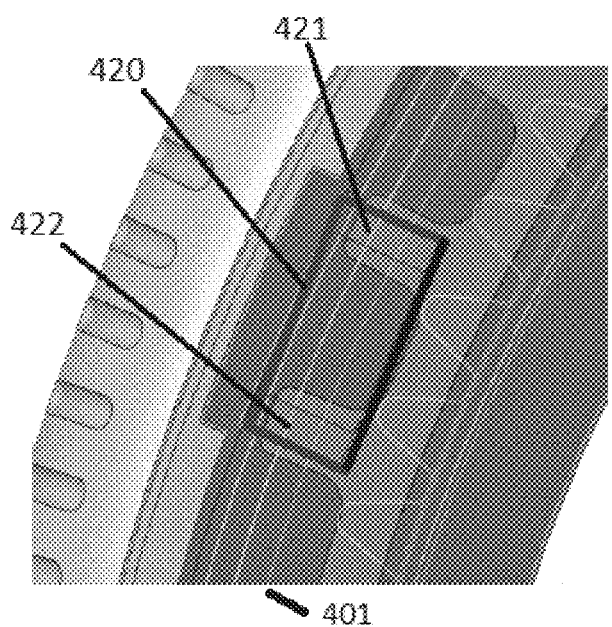
FIG. 4B depicts a see-through view of a mechanical haptic feedback gear module, according to an alternative embodiment of FIG. 1.

FIGS. 4A-B depict focused, see-through views of a GM 401, according to an alternative embodiment of FIGS. 1 and 3A-B. In embodiments, the wheel module 400 may comprise a similar construction as that depicted in FIG. 1, therefore, a duplicate description will not be provided with reference to FIGS. 1A-B. However, in lieu of or in addition to magnets described herein, magnetic plates 420 may be incorporated into the UGM (not depicted). In embodiments, the UGM may be configured with one or more pockets to accept an equal number of magnetic plates 420. As similarly depicted in FIG. 1, four magnetic plates 420 may be inserted into their corresponding pockets and may be distributed equally throughout the UGM (e.g., a 90° distribution). Magnetic plates 420 may be inserted into the UGM via a coupling assembly (e.g., latches, adhesive, etc.) such that the magnetic plates 420 and UGM may be integrated as a single piece within the GM.

In embodiments, four magnetic plates 420 may be incorporated into the GM 401, however, the foregoing is illustrative of various example embodiments and is not to be construed as limiting thereof. The number of magnetic plates 420 may vary according to haptic feedback preferences and overall size of the wheel module 400. In an example, three magnetic plates 420 may be incorporated into the GM 421 with a 120° distribution. In an example, eight magnetic plates and pockets may be incorporated into the GM 421 with a 45° distribution. Therefore, as the number of magnetic plates 420 incorporated into GM 401 increases (e.g., for even magnet distribution), their degree of distribution will continue to approach a 0° distribution. An increase or decrease in the number of magnetic plates 420 may increase or decrease, respectively, the amount of haptic feedback experienced.

Figure 5:
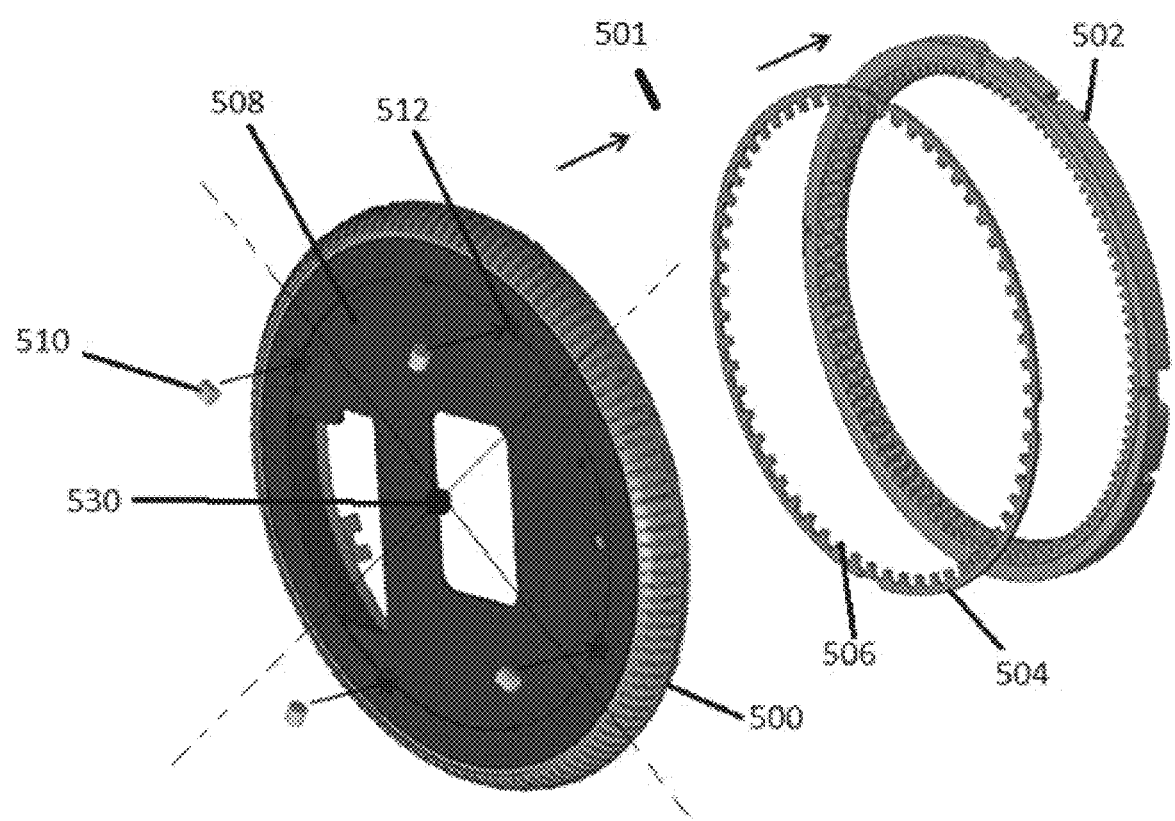
FIG. 5 depicts an exploded view of a haptic feedback gear module, according to an embodiment.

FIG. 5 depicts an exploded view of a gear module (GM) 501, according to an embodiment. In embodiments, GM 501 includes an internal gear module (IGM) 502 (e.g., a polyoxymethylene (POM) or other type of plastic gear) configured to accept a daisy wheel 504 with a plurality of internal teeth 506, such that the IGM 502 and daisy wheel 504 may be integrated as a single piece within the GM 501. In embodiments, the daisy wheel 504 may be constructed of a Ferrous (or other magnetic type) material and may be coated with a substance that prevents corrosion. In embodiments, an integrated gear module holder (Int. GM) 508, integrated to partially encompass the IGM 502, may be configured with one or more pockets 512 to accept an equal number of magnets 510 (e.g., neodymium magnets).

In embodiments, four magnets 510 may be placed into corresponding pockets 512 and may be distributed equally throughout the Int. GM 508. Placement of magnets 510 may include any form of adhesive (e.g., glue) such that the magnets 510 and Int. GM 508 form a single piece within the GM 501. In embodiments, as the wheel module 500 rotates, about a center axis 530, the daisy wheel 504 rotates about the center axis 530, which causes magnetic force interaction with the magnets 510. The daisy wheel configured to rotate around and on the same, horizontal plane as the magnets 510 (e.g., the daisy wheel 504 and teeth 506 being outside the diameter of and parallel with the magnets 510). The rotation of the teeth 506 around the stationary magnets 510 (i.e., the attraction and detraction between the magnets 510 and each tooth of the daisy wheel 504 as the daisy wheel 504 rotates) generates haptic feedback. In embodiments, as each tooth 506 rotates towards a magnet 510, adjacently aligns with the magnet 510 and then rotates past and away from the magnet 510, a haptic feedback instance may be produced (e.g., a click or pulse indicating a unit of rotation based on the spacing between the teeth 506 of the daisy wheel 504), described further in FIGS. 6-7B.

Figure 6:
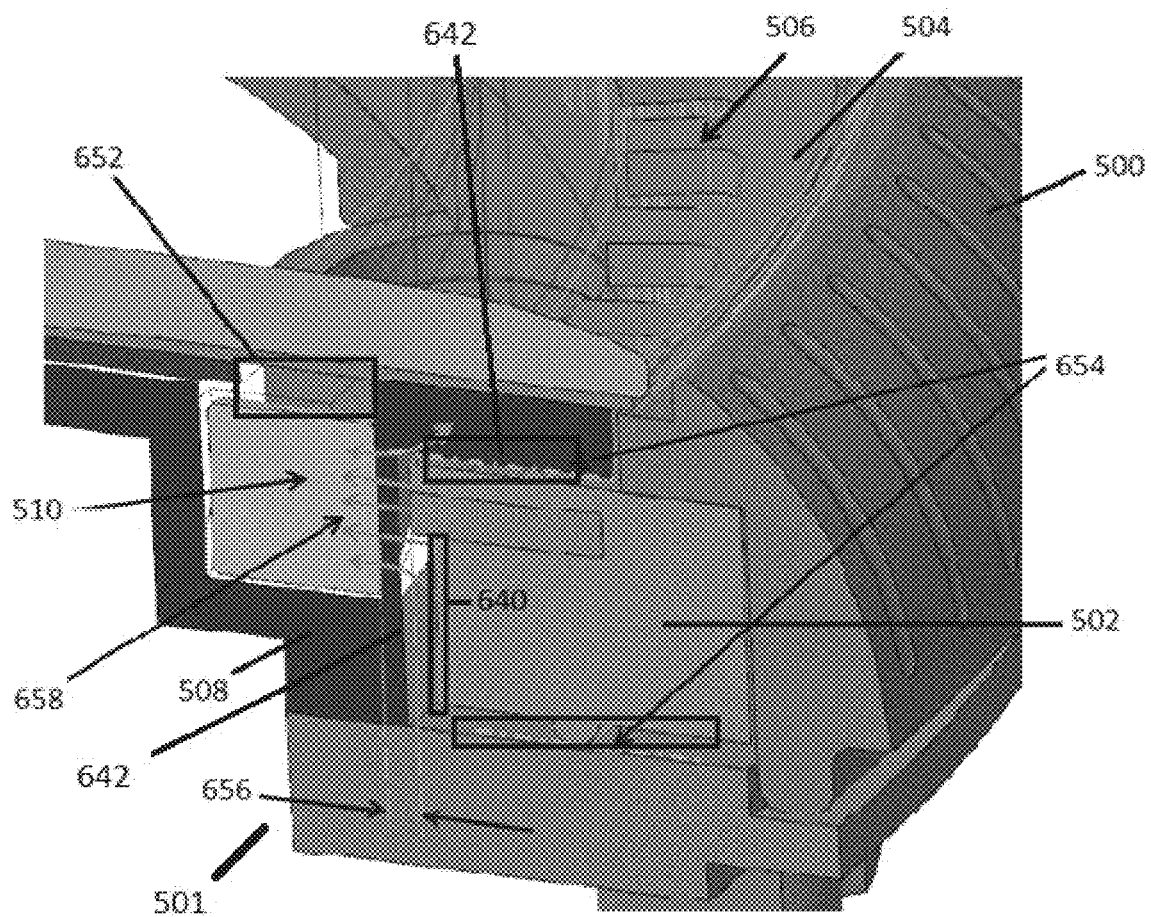
FIG. 6 depicts a cross-section view of a haptic feedback gear module, according to an embodiment of FIG. 5.

FIG. 6 depicts a cross-section view of a gear module 501 of a mechanical haptic feedback system, according to an embodiment of FIG. 5. In embodiments, the IGM 502 (incorporated with the daisy wheel 504) and the Int. GM 508 may be configured to coalesce such that the Int. GM 508 may be adapted to partially encompass the IGM 602 via the external edges 642 of the IGM 502. In embodiments, magnets 510 may be configured to align adjacent to the teeth 506 of the daisy wheel 504 via the internal edges 640 of the IGM 602. In embodiments, as the wheel module 500 rotates, about a center axis (not depicted), each component, but for the Int. GM 508 and the incorporated magnets 510, may rotate about the axis 530 causing teeth 506 to rotate around the Int. GM 508. In Embodiments, each tooth 506 may periodically pass by and away from each magnet 510 to cause magnetic interaction between at the rotating teeth 506 and the adjacent, stationary magnets 510. Haptic feedback may result from the magnetic interaction (i.e., the attraction and detraction between the magnets 510 and each tooth of the daisy wheel 504 as the wheel module 500 and the corresponding components rotate around the stationary magnets 510), further described in FIGS. 7A-B.

Additional features may be applied to the wheel module 500, thus increasing performance. In embodiments, an optional substance (e.g., foam or glue) 652 may be incorporated above or surrounding the magnet(s) 510. The substance 652 incorporated to prevent the magnet(s) from rocking or otherwise moving within their pockets 512. In embodiments, layers of an alternative substance 654 (e.g., a lubricant film) may be incorporated above and below the IGM 502. The substance 654 creating a layer in which the internal gear (e.g., IGM 502, Int. GM 508, etc.) may float or otherwise slide freely. Thus, a reduction of friction between components and a maximized magnetic pull 658 may be realized, which allows for significant haptic feedback. In embodiments, a small gap 656 (e.g., 0.4 mm) may be utilized between a portion of the Int. GM 508 and the IGM 502 to improve the magnetic pulling forced created by magnet(s) 510.

Figure 7A:
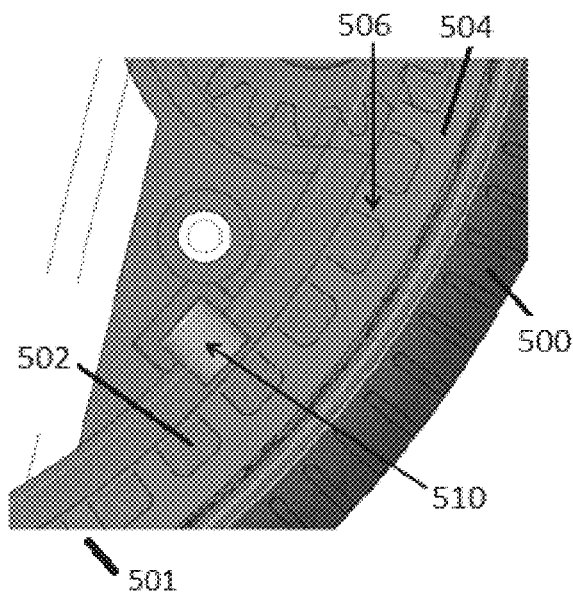
FIG. 7A depicts a see-through view of a haptic feedback gear module, according to an embodiment of FIG. 5.
Figure 7B:
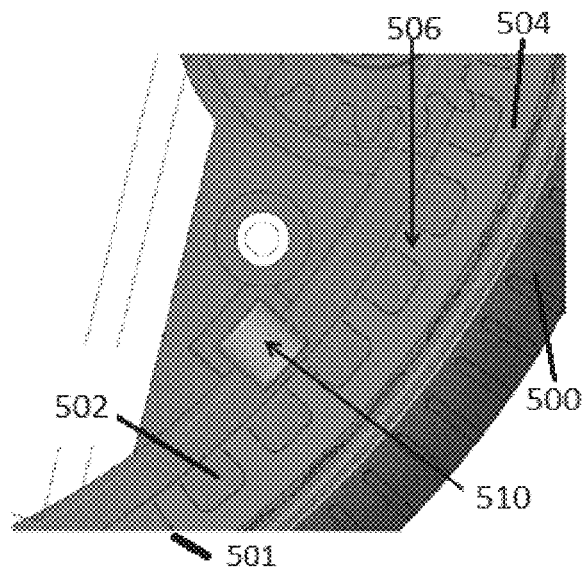
FIG. 7B depicts a see-through view of a haptic feedback gear module, according to an embodiment of FIG. 5.

FIGS. 7A-B depict see-through views of a GM 501, according to an embodiment of FIGS. 5-6. In embodiments, the magnet(s) 510 distributed throughout the IGM (not depicted) may become aligned and misaligned with teeth 506 of the daisy wheel 504 (incorporated into IGM 502) as the wheel module 500 rotates (e.g., counterclockwise or clockwise) about a center axis (not depicted). FIG. 7A illustrates an instance in which, during rotation of the wheel module 500, a magnet 510 is misaligned with teeth 506. In this instance, the position of the magnet 510, relative to the teeth 506, creates a low magnetic attraction force. FIG. 7B illustrates an instance in which, during rotation of the wheel module 500, a magnet 510 is aligned with teeth 506. In this instance, the position of the magnet 510, relative to the teeth 506, creates a high magnetic attraction force. As the magnets 510 alternate between alignment and misalignment, magnetic force is increased and decreased between the magnets 510 and the teeth 506, resulting in pure mechanical haptic feedback generation.

Figure 8:
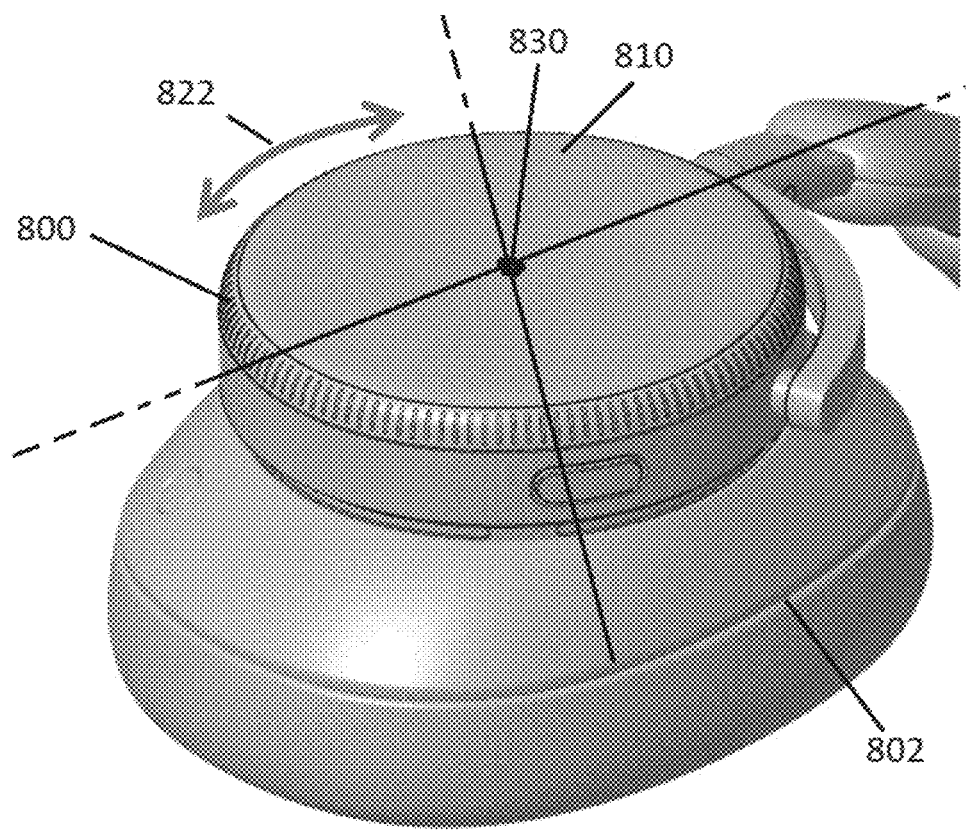
FIG. 8 depicts a wearable device with an integrated wheel module, according to embodiments.

FIG. 8 depicts a wearable device with an integrated wheel module 800, according to embodiments. In embodiments, a wheel module 800, as similarly described herein, may be incorporated into one or more headphones/earpieces 802. In embodiments, the wheel module 800 may be configured to attach and detached, or otherwise be integrated into an electronic device, such as one or more headphones/earpieces 802, via a rear-surface (not shown). In embodiments, the wheel module 800 comprises a front surface 810 to be displayed outward from the one or more headphones/earpieces 802, facing an individual. In embodiments, the GM (not shown) may reside within the wheel module 800 (described herein). When integrated into the one or more headphones/earpieces 802, comprising one or more speakers (not shown), the wheel module 800 may act as a wheel or dial that may be freely rotated (360°) in a clockwise and counterclockwise rotation 822 about its center axis 830. In turn, at least one component of the incorporated GM (not shown) may be rotated about axis 830 (e.g., the magnets as described herein) to generate pure haptic feedback, wherein pure haptic feedback includes generating haptic feedback without the use of embedded hardware, linear or counterweight vibrators, piezoelectricity ceramic disc, or the use of audio sounds feedback. In embodiments, the speed and force to rotate the wheel module 800 is the only force required to generate pure haptic feedback (i.e., the physical rotation of the wheel module 800 is the only force causing the magnets within the GM to rotate about the teeth of the daisy wheel, thus resulting in pure haptic feedback generation). In embodiments, the rotation of the wheel module 800 may correspond to/alter any number of preferences (e.g., units of measurement) in which the wheel module 800 is integrated, such as volume control (up or down), transparency mode level, transparency of active noise-cancelling (ANC) functions, or other functions, as assigned and programmed by appropriate software.

For example, when the wheel module 800 is rotated, each magnet (incorporated into a GM (not shown) and integrated within the wheel module 800) may rotate towards a tooth (not shown), align with a tooth and then rotate past and away from a tooth, resulting in one or more pure haptic feedback instances as described herein. In embodiments, a click or pulse sensation, indicating a unit of rotation has been achieved based on the spacing between the teeth of the daisy wheel, may be realized during wheel module 800 rotation. In embodiments, a haptic feedback instance may indicate an increase or decrease of a unit of volume associated with the headphones/earpieces 802.

As previously mentioned, many conventional haptic feedback systems consume power from the device in which they are incorporated. Thus, the haptic feedback systems may drain power otherwise utilized by the device itself. This additional power drainage, effectively, may reduce the amount of operating time the device may realize. In embodiments described herein, no electricity is necessary to generate haptic feedback. The force emitted onto the wheel module is transmitted onto the GM, thus rotating the magnets around the teeth of a daisy to generate haptic feedback, which reserves otherwise wasted power for use by the electronic device. Furthermore, the size of the GM and the number of incorporated magnets (including how powerful the magnets are) can be adapted to fit any device variation and any desired intensity of haptic feedback and will remain functional so long as the magnets hold a magnetic force, and the wheel module/GM rotates. No programming of software, updates, charging, etc., is necessary. Furthermore, no additional components, such as actuators or counterweights, are necessary, which makes the device smaller, easier to integrate, and less likely to need maintained overtime. Compared to other conventional haptic feedback systems, the embodiments described herein provide an elegant, yet simplistic mechanism designed to utilize magnets to generate pure mechanical haptic feedback within a wearable device, such as headphones.

Additionally, such conventional systems may be complex or cumbersome relative to the device in which the haptic feedback system is integrated. Such integration may render maintenance of the device (e.g., battery changing) extremely difficult, if not impossible.

Various embodiments of systems, devices, and methods have been described herein. These embodiments are given only by way of example and are not intended to limit the scope of the disclosure. It should be appreciated, moreover, that the various features of the embodiments that have been described may be combined in various ways to produce numerous additional embodiments. Moreover, while various materials, dimensions, shapes, configurations, and locations, etc., have been described for use with disclosed embodiments, others besides those disclosed may be utilized without exceeding the scope of the disclosure.

Persons of ordinary skill in the relevant arts will recognize that the subject matter hereof may comprise fewer features than illustrated in any individual embodiment described above. The embodiments described herein are not meant to be an exhaustive presentation of the ways in which the various features of the subject matter hereof may be combined. Accordingly, the embodiments are not mutually exclusive combinations of features; rather, the various embodiments can comprise a combination of different individual features selected from different individual embodiments, as understood by persons of ordinary skill in the art. Moreover, elements described with respect to one embodiment can be implemented in other embodiments even when not described in such embodiments unless otherwise noted.

Although a dependent claim may refer in the claims to a specific combination with one or more other claims, other embodiments can also include a combination of the dependent claim with the subject matter of each other dependent claim or a combination of one or more features with other dependent or independent claims. Such combinations are proposed herein unless it is stated that a specific combination is not intended.

Any incorporation by reference of documents above is limited such that no subject matter is incorporated that is contrary to the explicit disclosure herein. Any incorporation by reference of documents above is further limited such that no claims included in the documents are incorporated by reference herein. Any incorporation by reference of documents above is yet further limited such that any definitions provided in the documents are not incorporated by reference herein unless expressly included herein.

For purposes of interpreting the claims, it is expressly intended that the provisions of 35 U.S.C. § 112(f) are not to be invoked unless the specific terms "means for" or "step for" are recited in a claim.

The invention claimed is:

1. A gear module for mechanical haptic feedback comprising:
a first gear module comprising a set of magnets arranged on a single plane of the first gear module, wherein the first gear module has a central axis; and
a second gear module comprising a daisy wheel having a plurality of teeth, wherein the second gear module is coaxial with the central axis of the first gear module,
wherein one of the first gear module or the second gear module is stationary and the other of the first gear module or the second gear module is rotatable about the central axis, such that, in use, as at least one of the set of magnets is aligned and then misaligned with at least one of the plurality of teeth, a mechanical haptic feedback to a user is generated by the gear module.

2. The gear module of claim 1, wherein the plurality of teeth extend outwardly from the daisy wheel and the daisy wheel is stationary relative to the set of magnets such that, during rotation, the set of magnets are rotationally aligned and misaligned vertically atop the plurality of teeth.

3. The gear module of claim 1, wherein the plurality of teeth extend internally from the daisy wheel and the set of magnets is stationary relative to the plurality of teeth such that, during rotation, the plurality of teeth is rotationally aligned and misaligned with the set of magnets on the same horizontal plane, parallel to the set of magnets.

4. The gear module of claim 1, wherein the set of magnets comprises a plurality of magnetic plates, wherein each magnetic plate comprises a north pole and a south pole.

5. The gear module of claim 1, each of the set of magnets is adhered within the first gear module.

6. The gear module of claim 1, wherein one of the first gear module or the second gear module is rotatable for 360 degrees about the central axis.

7. The gear module of claim 1, wherein the set of magnets is evenly distributed around the central axis in the first gear module.

8. The gear module of claim 1, wherein the gear module is integrated into a set of headphones and further comprises a grip wheel arranged externally on the set of headphones, and wherein rotation of the grip wheel by a user causes one or the other of the first gear module or the second gear module to rotate about the central axis.

9. The gear module of claim 8, wherein causing one or the other of the first gear module or the second gear module to rotate about the central axis changes a volume output or a noise canceling output of the set of headphones.

10. A method of generating pure mechanical haptic feedback comprising:

integrating a first gear module with a set of magnets arranged on a single plane of the first gear module, wherein the first gear module has a central axis;

integrating a second gear module with a daisy wheel having a plurality of teeth, wherein the second gear module is coaxial with the central axis of the first gear module;

generating one or more mechanical haptic feedback instances to a user, wherein one of the first gear module or the second gear module is rotating about the axis and the other one of the first gear module or the second gear module is stationary such that, during use, as at least one of the magnets is aligned and then misaligned with at least one of the plurality of teeth, mechanical haptic feedback instances are generated.

11. The method of claim 10, further comprising extending the plurality of teeth outwardly from the daisy wheel and securing the daisy wheel relative to the set of magnets such that, during rotation, the set of magnets are aligned and misaligned vertically above the plurality of teeth.

12. The method of claim 10, further comprising extending the plurality of teeth internally from the daisy wheel and securing the set of magnets relative to the teeth such that, during rotation, the plurality of teeth is rotationally aligned and misaligned with the set of magnets on the same horizontal plane, parallel to the set of magnets.

13. The method of claim 10, wherein the set of magnets further comprising a plurality of magnetic plates, wherein each magnetic plate comprises a north pole and a south pole.

14. The method of claim 10, further comprising adhering the set of magnets within the first gear module.

15. The method of claim 10, further comprising configuring one of the first gear module or the second gear module to be rotatable for 360 degrees about the central axis.

16. The method of claim 10, further comprising distributing the plurality of magnets evenly around the central axis in the first gear module.

17. The method of claim 10, further comprising incorporating a wheel module into a set of headphones and integrating a grip wheel externally arranged on the set of headphones, and wherein rotating the grip wheel by a user causes one or the other of the first gear module or the second gear module to rotate about the central axis.

18. The method of claim 17, wherein causing the one or the other of the first gear module or the second gear module to rotate about the central axis changes a volume output or a noise canceling output of the set of headphones.

19. A wearable device capable of externalizing sound comprising:

one or more headphones including one or more speakers; and a wheel module rotatable about an axis, configured to be integrated into at least one of the one or more headphones, wherein the wheel module comprises:

a first gear module comprising a set of magnets arranged on a single plane of the first gear module, wherein the first gear module has a central axis; and a second gear module comprising a daisy wheel having a plurality of teeth, wherein the second gear module is coaxial with the central axis of the first gear module, wherein one of the first gear module or the second gear module is stationary and the other of the first gear module or the second gear module is rotatable about the central axis, such that, in use, as at least one of the set of magnets is aligned and then misaligned with at least one of the plurality of teeth, a mechanical haptic feedback to a user is generated by the gear module.

20. The wearable device of claim 19, wherein rotation of the wheel module increments or decrements a unit of measurement associated with the headphones; and each unit of increment or decrement produces haptic feedback based on the alignment and misalignment between the set of magnets and the plurality of teeth.

* * * * *